(12) United States Patent
Osenbach et al.

(10) Patent No.: US 7,368,326 B2
(45) Date of Patent: May 6, 2008

(54) METHODS AND APPARATUS TO REDUCE GROWTH FORMATIONS ON PLATED CONDUCTIVE LEADS

(75) Inventors: John William Osenbach, Kutztown, PA (US); Brian Dale Potteiger, Reading, PA (US); Richard Lawrence Shook, Fogelsville, PA (US); Brian Thomas Vaccaro, Mertztown, PA (US)

(73) Assignee: Agere Systems Inc., Allentown, PA (US)

(*) Notice: Subject to any disclaimer, the term of this patent is extended or adjusted under 35 U.S.C. 154(b) by 342 days.

(21) Appl. No.: 10/855,148

(22) Filed: May 27, 2004

(65) Prior Publication Data

US 2005/0153532 A1   Jul. 14, 2005

Related U.S. Application Data

(60) Provisional application No. 60/535,839, filed on Jan. 12, 2004.

(51) Int. Cl.
| | |
|---|---|
| *H01L 21/50* | (2006.01) |
| *H01L 21/48* | (2006.01) |
| *H01L 21/44* | (2006.01) |
| *H01L 23/495* | (2006.01) |
| *H01L 23/52* | (2006.01) |
| *H01L 23/48* | (2006.01) |
| *H01L 23/40* | (2006.01) |

(52) U.S. Cl. ............... 438/123; 438/106; 438/124; 257/666; 257/677; 257/734; 257/735; 257/736; 257/766; 257/692; 257/E23.053; 257/E23.054; 257/E23.031; 257/E23.035

(58) Field of Classification Search ............... 438/123, 438/106, 124; 257/666, 677, 734, 736, 766, 257/692, E23.053, E23.054, E23.31, E23.35, 257/E23.041
See application file for complete search history.

(56) References Cited

U.S. PATENT DOCUMENTS

| 5,994,767 | A * | 11/1999 | Huang et al. ............... 257/666 |
| 6,194,777 | B1 * | 2/2001 | Abbott et al. ............... 257/666 |
| 6,646,330 | B2 * | 11/2003 | Kubara et al. .............. 257/677 |
| 6,713,852 | B2 * | 3/2004 | Abbott et al. ............... 257/677 |
| 2002/0088845 | A1 * | 7/2002 | Tanaka et al. .............. 228/254 |
| 2004/0183166 | A1 * | 9/2004 | Abbott ........................ 257/666 |

* cited by examiner

*Primary Examiner*—Luan Thai
(74) *Attorney, Agent, or Firm*—Ryan, Mason & Lewis, LLP

(57) ABSTRACT

A process includes annealing one or more plated conductive leads at a predetermined temperature. The one or more plated conductive leads are plated with one or more layers, where each layer comprises a material. The predetermined temperature is greater than or equal to approximately a melting point of one of the materials. The annealing can reduce growth formations, such as whiskers, on the one or more conductive leads. Lead frames and other devices having plated conductive leads may be subjected to the process, and the resultant plated conductive leads will have fewer growth formations than plated conductive leads not subjected to the process. The plated conductive leads may be trimmed and formed prior to or after the anneal.

26 Claims, 12 Drawing Sheets

| TEST | 1-2um | 5-7um | 9-11um | >15um |
|---|---|---|---|---|
| RT (5170HRS) | WHISKERS | WHISKERS | NO WHISKERS | NO WHISKERS |
| 60C (2972HRS) | WHISKERS | WHISKERS | NO WHISKERS | NO WHISKERS |
| 60C / 93%RH NO CONDENSATION (4570HRS) | WHISKERS | WHISKERS | WHISKERS | NO WHISKERS |
| 60C / 93%RH NO CONDENSATION (4570HRS) | WHISKERS | WHISKERS | WHISKERS | FLOWERS*/WHISKERS |
| -55C / 85C T/C (1700 CYCLES) | WHISKERS | WHISKERS | WHISKERS | NO WHISKERS |

FIG. 6

| *MATERIAL | BAKE | T$_{reflow}$ | RT STORAGE TIME = 56d | TC -55C-+85C 2000 CYCLES | 60C/93%RH STORAGE TIME = 68d | 60C/93%RH BIAS (4.4 & 5V) TIME = 68d |
|---|---|---|---|---|---|---|
| Cu/Sn/1.5 | NO | NO | WHISKERS | WHISKERS | WHISKERS | ----- |
| Cu/Sn/1.5 | YES | NO | WHISKERS | WHISKERS | WHISKERS | ----- |
| Cu/Sn/15 | NO | NO | NO WHISKERS | NO WHISKERS | NO WHISKERS | NO WHISKERS |
| Cu/Sn/15 | YES | NO | NO WHISKERS | WHISKERS | NO WHISKERS | NO WHISKERS |
| Cu/Sn/15 | YES | 215C | NO WHISKERS | NO WHISKERS | NO WHISKERS | NO WHISKERS |
| Cu/Sn/15 | YES | 260C | NO WHISKERS | WHISKERS | WHISKERS | WHISKERS |
| **Cu/Sn/1.5 | NO | NO | NO WHISKERS | WHISKERS | NO WHISKERS | NO WHISKERS |
| Cu/Ni/Sn/1.5 | YES | NO | NO WHISKERS | WHISKERS | NO WHISKERS | NO WHISKERS |
| Cu/Ni/Sn/15 | NO | NO | NO WHISKERS | WHISKERS | NO WHISKERS | NO WHISKERS |
| Cu/Ni/Sn/15 | NO | 215 | NO WHISKERS | WHISKERS | NO WHISKERS | NO WHISKERS |
| Cu/Ni/Sn/15 | NO | 260 | NO WHISKERS | NO WHISKERS | NO WHISKERS | NO WHISKERS |
| Cu/Ni/Sn/15 | YES | NO | NO WHISKERS | WHISKERS | NO WHISKERS | NO WHISKERS |
| Cu/Ni/Sn/15 | YES | 215 | NO WHISKERS | WHISKERS | NO WHISKERS | NO WHISKERS |
| Cu/Ni/Sn/15 | YES | 260 | NO WHISKERS | NO WHISKERS | NO WHISKERS | NO WHISKERS |

FIG. 8

| MATERIAL | BAKE | $T_{reflow}$ | 60C/93%RH STORAGE TIME = 32d | 60C/93%RH STORAGE TIME = 68d | 60C/93%RH STORAGE TIME = 131d |
|---|---|---|---|---|---|
| Cu/Sn/1.5 | NO | NO | WHISKERS | WHISKERS | TERMINATED |
| Cu/Sn/1.5 | YES | NO | NO WHISKERS | WHISKERS | TERMINATED |
| Cu/Sn/15 | NO | NO | NO WHISKERS | NO WHISKERS | TERMINATED |
| Cu/Sn/15 | YES | NO | NO WHISKERS | NO WHISKERS | TERMINATED |
| Cu/Sn/15 | YES | 215C | NO WHISKERS | NO WHISKERS | TERMINATED |
| Cu/Sn/15 | YES | 260C | NO WHISKERS | WHISKERS | TERMINATED |
| Cu/Sn/15 | YES | NO | NO WHISKERS | NO WHISKERS | NO WHISKERS |
| Cu/Ni/Sn/1.5 | NO | NO | NO WHISKERS | NO WHISKERS | ON TEST |
| Cu/Ni/Sn/1.5 | YES | NO | NO WHISKERS | NO WHISKERS | ON TEST |
| Cu/Ni/Sn/15 | NO | NO | NO WHISKERS | NO WHISKERS | ON TEST |
| Cu/Ni/Sn/15 | NO | 215 | NO WHISKERS | NO WHISKERS | ON TEST |
| Cu/Ni/Sn/15 | NO | 260 | NO WHISKERS | NO WHISKERS | NO WHISKERS |
| Cu/Ni/Sn/15 | YES | NO | NO WHISKERS | NO WHISKERS | ON TEST |
| Cu/Ni/Sn/15 | YES | 260 | NO WHISKERS | NO WHISKERS | NO WHISKERS |
| Cu/Ni/Sn/15 | YES | 215 | NO WHISKERS | NO WHISKERS | ON TEST |

FIG. 9

| *MATERIAL | BAKE | $T_{reflow}$ | CONDENSATION STORAGE 60C/93%RH TIME = 68d | |
|---|---|---|---|---|
| Cu/Sn/15 | NO | NO | NO WHISKERS | FLOWERS (>10/50 LEADS) |
| Cu/Sn/15 | YES | NO | NO WHISKERS | FLOWERS (>10/50 LEADS) |
| Cu/Sn/15 | YES | 215C | NO WHISKERS | FLOWERS (5/528 LEADS) |
| Cu/Sn/15 | YES | 260C | WHISKERS | WHISKERS/NO FLOWERS (0/528 LEADS) |
| Cu/Ni/Sn/15 | NO | NO | NO WHISKERS | FLOWERS (>10/84 LEADS) |
| Cu/Ni/Sn/15 | NO | 215 | NO WHISKERS | FLOWERS (3/252 LEADS) |
| Cu/Ni/Sn/15 | NO | 260 | NO WHISKERS | NO FLOWERS (0/252 LEADS) |
| Cu/Ni/Sn/15 | YES | NO | NO WHISKERS | FLOWERS (>10/84 LEADS) |
| Cu/Ni/Sn/15 | YES | 215 | NO WHISKERS | FLOWERS (2/252 LEADS) |
| Cu/Ni/Sn/15 | YES | 260 | NO WHISKERS | NO FLOWERS (0/252 LEADS) |

FIG. 10

| *MATERIAL | BAKE | T$_{reflow}$ | TC (-55C-+85C 1000 CYCLES) |
|---|---|---|---|
| Cu/Sn/15 | NO | NO | NO WHISKERS |
| Cu/Sn/15 | NO | 200C | WHISKERS / HIGH DENSITY ~ 20-30um |
| Cu/Sn/15 | NO | 235C | NO WHISKERS |
| Cu/Sn/15 | YES | 260C | NO WHISKERS |
| Cu/Sn/15 | YES | NO | NO WHISKERS |
| Cu/Sn/15 | YES | 200C | WHISKERS / HIGH DENSITY ~ 20-30um |
| Cu/Sn/15 | YES | 215C | WHISKERS / MEDIUM DENSITY ~ 20-30um |
| Cu/Sn/15 | YES | 225C | WHISKERS / LOW DENSITY ~ 5-10um |
| Cu/Sn/15 | YES | 235C | NO WHISKERS |
| Cu/Sn/15 | YES | 260C | NO WHISKERS |
| Cu/Ni/Sn/15 | NO | NO | WHISKERS / MEDIUM DENSITY ~ 20-30um |
| Cu/Ni/Sn/15 | NO | 200C | WHISKERS / MEDIUM DENSITY ~ 20-30um |
| Cu/Ni/Sn/15 | NO | 215C | WHISKERS / MEDIUM DENSITY ~ 20-30um |
| Cu/Ni/Sn/15 | NO | 225C | WHISKERS / LOW DENSITY ~ 5-10um |
| Cu/Ni/Sn/15 | NO | 235C | NO WHISKERS |
| Cu/Ni/Sn/15 | NO | 260C | NO WHISKERS |
| Cu/Ni/Sn/15 | YES | NO | WHISKERS / MEDIUM DENSITY ~ 20-30um |
| Cu/Ni/Sn/15 | YES | 200 | WHISKERS / MEDIUM DENSITY ~ 20-30um |
| Cu/Ni/Sn/15 | YES | 235 | NO WHISKERS |

METHODS AND APPARATUS TO REDUCE GROWTH FORMATIONS ON PLATED CONDUCTIVE LEADS

CROSS-REFERENCE TO RELATED APPLICATIONS

The present invention claims the benefit of U.S. Provisional Patent Application No. 60/535,839, filed on Jan. 12, 2004.

FIELD OF THE INVENTION

The present invention relates generally to packaging for electronic circuits, and, more particularly, to processing conductive leads for electronic circuits.

BACKGROUND OF THE INVENTION

A "lead frame" is a device commonly used to attach semiconductor dies to a circuit board. An example follows of how a typical lead frame may be used to attach a semiconductor die to a circuit board. The semiconductor die is attached to an inner portion of the lead frame, and wire bonds are run from the semiconductor die to conductive leads integral to the lead frame. The lead frame has a body that allows the lead frame to be picked up and moved during procedures such as bonding of the wire bonds from the semiconductor die to the conductive leads. The body also surrounds the conductive leads, which are initially flat and supported by a tie bar, which is connected to the body.

Once the semiconductor die is connected to the conductive leads, molding is performed so that mold compound fills the inner and other portions of the lead frame. The conductive leads are typically made of copper (Cu), although other materials may be used. Cu tends not to bond well with materials used during soldering of the conductive leads to a circuit board. Consequently, the copper is generally plated with another metal, such as tin (Sn), which does bond well with soldering materials.

A "trim and form" process is performed, during which the tie bar is removed, as is the body of the lead frame. The trim and form process additionally forms the conductive leads into particular shapes suitable for soldering to pads of a circuit board.

While the lead frame and its processing have been used for many years, certain types of conductive leads can have growth formation. For instance, Sn-plated Cu has growths of Sn, called "whiskers," that extend from the surface of the conductive lead. These whiskers have been documented since about 1946, and failures attributed to the whiskers have been documented as early as 1954.

One solution that minimizes or prevents whisker formation is plating the Cu with a lead (Pb)—Sn layer. Recently, however, legislation in Europe requires that Pb be eliminated from electronic devices.

A need therefore exists for Pb-free plated conductive leads, devices made therefrom and methods for forming the same that also have limited or no growth formations.

SUMMARY OF THE INVENTION

Generally, methods and apparatus are provided for reducing growth formations on conductive leads.

In an exemplary embodiment, a process includes annealing one or more plated conductive leads at a predetermined temperature. The one or more plated conductive leads are plated with one or more layers, where each layer comprises a material. The predetermined temperature is greater than or equal to approximately a melting point of one of the materials. The annealing can reduce growth formations, such as whiskers, on the one or more conductive leads. Lead frames and other devices having plated conductive leads may be subjected to the process, and the resultant plated conductive leads will have fewer growth formations than plated conductive leads not subjected to the process. The plated conductive leads may be trimmed and formed prior to or after the anneal.

A more complete understanding of the present invention, as well as further features and advantages of the present invention, will be obtained by reference to the following detailed description and drawings.

BRIEF DESCRIPTION OF THE DRAWINGS

FIG. 6 shows a table illustrating whether growth formations were found on Sn-plated Cu conductive leads subjected to a 150 degrees Centigrade (° C.) anneal;

FIG. 8 shows a table illustrating whether growth formations were found on two types of plated conductive leads under various types of processing, tests, and annealing;

FIG. 9 shows a table illustrating a time evolution in a non-condensing environment for growth formations on two types of plated conductive leads under various types of processing, tests, and annealing;

FIG. 10 shows a table illustrating whether growth formations were found on two types of plated conductive leads under various types of processing and annealing in a condensing environment during storage; and FIG. 11 shows a table illustrating whether growth formations were found on two types of plated conductive leads under various types of processing and annealing when subjected to 1000 cycles of temperature from −55° C. to 85° C.

DETAILED DESCRIPTION

Figure 1:
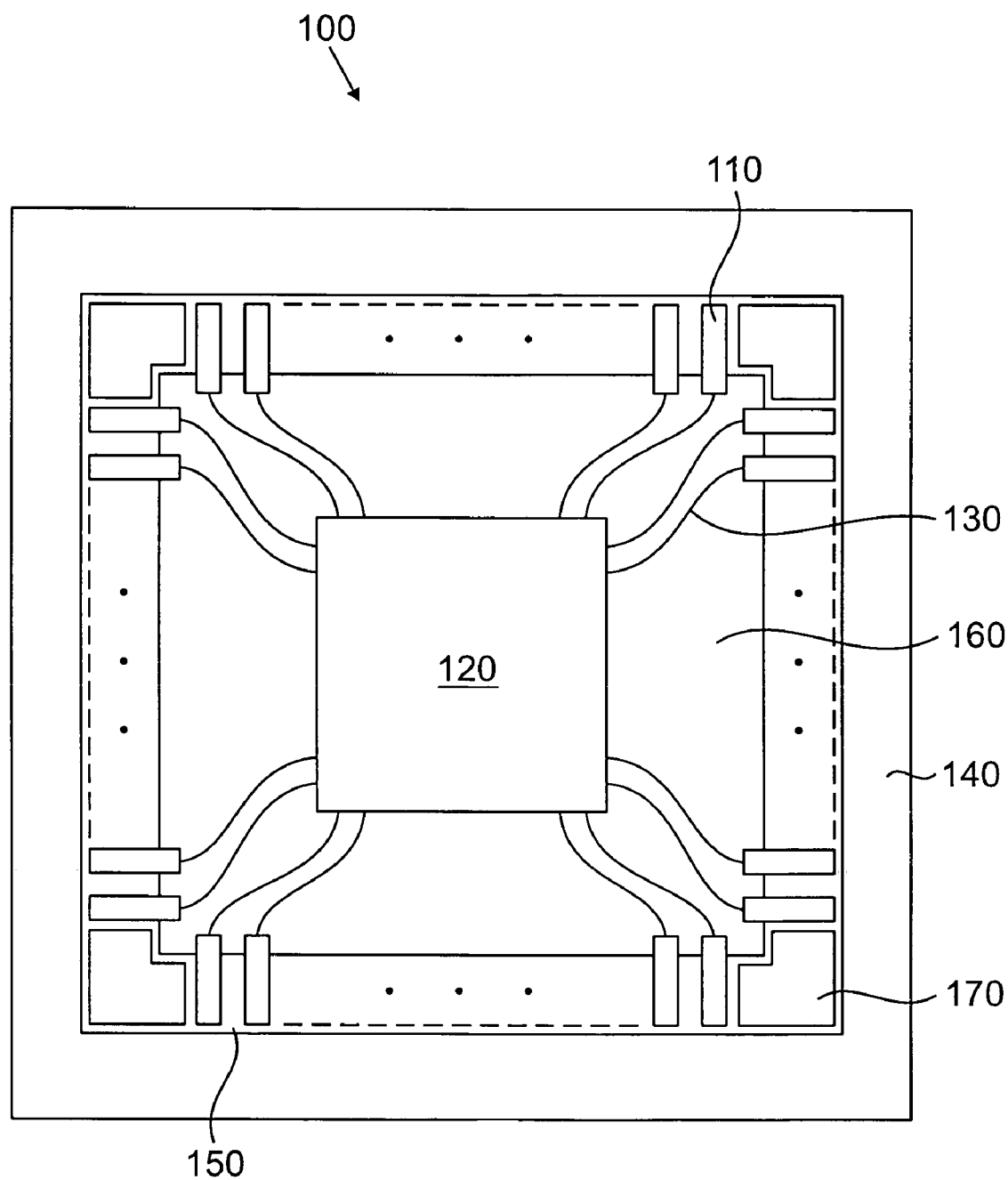
FIG. 1 is a top view of an exemplary lead frame.

As described above, electrochemically plated Pb—Sn layers on Cu are commonly used surface finishes for electronic packages having conductive leads. New legislation in Europe requires that Pb be eliminated from electronic devices. As such, there is a need for a replacement of the Pb—Sn layers. A low-cost drop in Pb—Sn replacement is matte Sn. Unfortunately, growth formations, such as Sn whiskers, can nucleate and grow in matte Sn finishes. Such growth formations are believed to occur to relieve global and local mechanical strains. Sn whiskers are mechanically strong and can carry a significant current density. Thus, the whiskers can cause intermittent or catastrophic device failure. Such failures have been reported and continue to be reported.

The present invention can be used to reduce growth formations on conductive leads. Growth formations are any formations that extend from a surface of the conductive leads. Examples of growth formations are whiskers, which are defined as being growth formations greater than 10 micrometer (μm), and "flowers," which are clusters of whiskers. A flower therefore has two or more whiskers within a small distance.

General observations of whiskers are as follows.

1. Whiskers are typically 3-4 micrometer (μm) in diameter, with some as large as 7 μm being reported.
2. Whiskers are typically 2-4 millimeter (multimedia) long (9 mm length has been reported).
3. Whiskers typically are solid, but hollow whiskers have also been reported.
4. Whiskers typically grow from the interface between the Sn finish and an underlying layer.
5. Whiskers are mechanically strong.
6. Whiskers can grow through 50 μm of soft passivation. Some reports say that 1.5 mm of polymer is needed to prevent whisker growth from one conductive lead to another, which will cause an electrical short to occur. Other reports say 50 μm of hard covering (e.g., epoxy) is good enough to prevent whisker growth from one conductive lead to another. Even with a hard covering, voids in encapsulation (e.g., mold compound) could still be problematic and permit whisker growth.
7. Whiskers typically grow at 0.03-9 mm/year, but sometimes are not observed for nine or even 20 years of service.
8. Typical density of whiskers ranges from three to 500/mm².
9. Whiskers are observed more frequently when packages are subjected to temperature cycles from −40° C. to 85° C., storage at temperatures of 50-60° C. and greater than 85 percent Relative Humidity (RH). Some reports show fast growth under other conditions.
10. Whiskers grow in a variety of atmospheres, including a vacuum, a liquid, and moist air.
11. Whiskers have been observed on integrated circuits, passive electrical circuits, and mechanical devices.
12. Whiskers have caused failure in satellites, and have been responsible for recall of pace makers. Whiskers frequently occur when the temperature of the storage environment for the conductive leads is less than or equal to half the melting point of the material from which the whiskers form. For instance, Sn has a melting point of 232° C., so a storage environment under about 116° C. can lead to more whisker formation than a storage environment above 116° C. might cause to be formed.
13. Whiskers are not unique to Sn. Instead, whisker growth has been found to occur on other low melting point metals, such as indium (In), cadmium (Cd), zinc (Zn), antimony (Sb), and to a lesser extent on higher melting point materials, such as lead (Pb), iron (Fe), nickel (Ni), gold (Au), silver (Ag), and palladium (Pd).
14. Whiskers are more likely to occur when Sn is directly on Cu or brass, but are less likely to occur when Sn is directly on Ni or steel. Nonetheless, whiskers are still observed, although the observed whiskers have lower growth rate, density, and size.
15. Bright Sn is more susceptible to whisker formation than matte Sn. Bright Sn is typically made by added organic chemicals to the plating bath used to plate a material (e.g., Cu or Ni) Bright Sn has small grin size and very shiny. On the other hand, matte Sn is typically made by adding no additional grain refiners to the plating bath, and matte Sn consequently has a gray, matte like appearance. Susceptibility to whisker formation also depends upon the organic brightener used. Morphology and stress state are believed to cause the higher susceptibility: For example, all else being equal, the propensity for whisker growth decreases with increasing grain size, gs, of Sn. Note that $gs_{bright} < gs_{matte}$ for Sn.

As described above, plated conductive leads typically are made of a Cu core that is then plated with one or more materials. Conductive leads having a Cu core, then Ni underplate (e.g., Ni plated on the Cu core) and a plated Sn finish have been reported to solve the whisker formation problem. The structure for a conductive lead of a Cu core plated by a Ni underplate plated by a Sn finish is referred to as a "Cu/Ni/Sn structure" herein. It has been found and will be shown in detail below that conductive leads made of the Cu/Ni/Sn structure are not whisker free, if an anneal of about or greater than the melting point of Sn is not performed. For example, it has been found that Sn whiskers can form on conductive leads made from the Cu/Ni/Sn structure when conductive leads comprising the structure are exposed to lead free board attach processing (e.g., peak temperature less than about 232° C., which is the melting point of Sn). It has been found, however, that exposure, through an anneal, of conductive leads having the Cu/Ni/Sn structure to temperatures above the melting point of Sn does in fact substantially eliminate whisker formation. The same is however not true when Ni is not present as an underplate, although annealing a Sn finish on a Cu conductive lead at 150° C. after Sn plating is shown herein to reduce whisker formation prior to reflow. As shown below, however, whiskers are still found after reflow, even when the reflow occurs at temperatures greater than 232° C.

In an exemplary embodiment of the present invention, therefore, a 0.3-31 μm thick plated Ni underplate layer is formed between a Cu lead frame (e.g., comprising a number of conductive leads made of a Cu core) and a Sn finish, and a post plate anneal is performed at temperatures greater than or equal to approximately the melting point (e.g., 232° C.) of Sn to reduce whisker formation.

The present disclosure assumes that conductive leads are formed of Cu and that materials used to plate the Cu are Ni and Sn. However, as described above, other materials can be used to form the leads and the plating and the present invention can be applicable to conductive leads formed from those materials.

Turning now to FIG. 1., an exemplary lead frame 100 is shown. Lead frame 100 is merely illustrative and other types of lead frames may be used with the present invention. In fact, the present invention may be used any time that growth formations are to be reduced or eliminated and the present invention is not limited to conductive leads. Lead frame 100 comprises a number of conductive leads 110, a semiconductor die 120 (e.g., containing an integrated circuit), wire bonds 130, a body 140, a tie bar 150, an inner portion 160, and pads 170. In this example, a semiconductor die 120 has already been attached to a surface (not shown) of the inner portion 160 of the lead frame 100.

During an overmolding process, the inner portion 160 and other portions of the lead frame 100 are filled with mold compound. During a "trim and form" process, the tie bar 150 and the body 140 are removed and the conductive leads 110 are formed into shapes suitable for coupling (e.g., by solder to pads) to a circuit board.

Figure 2:
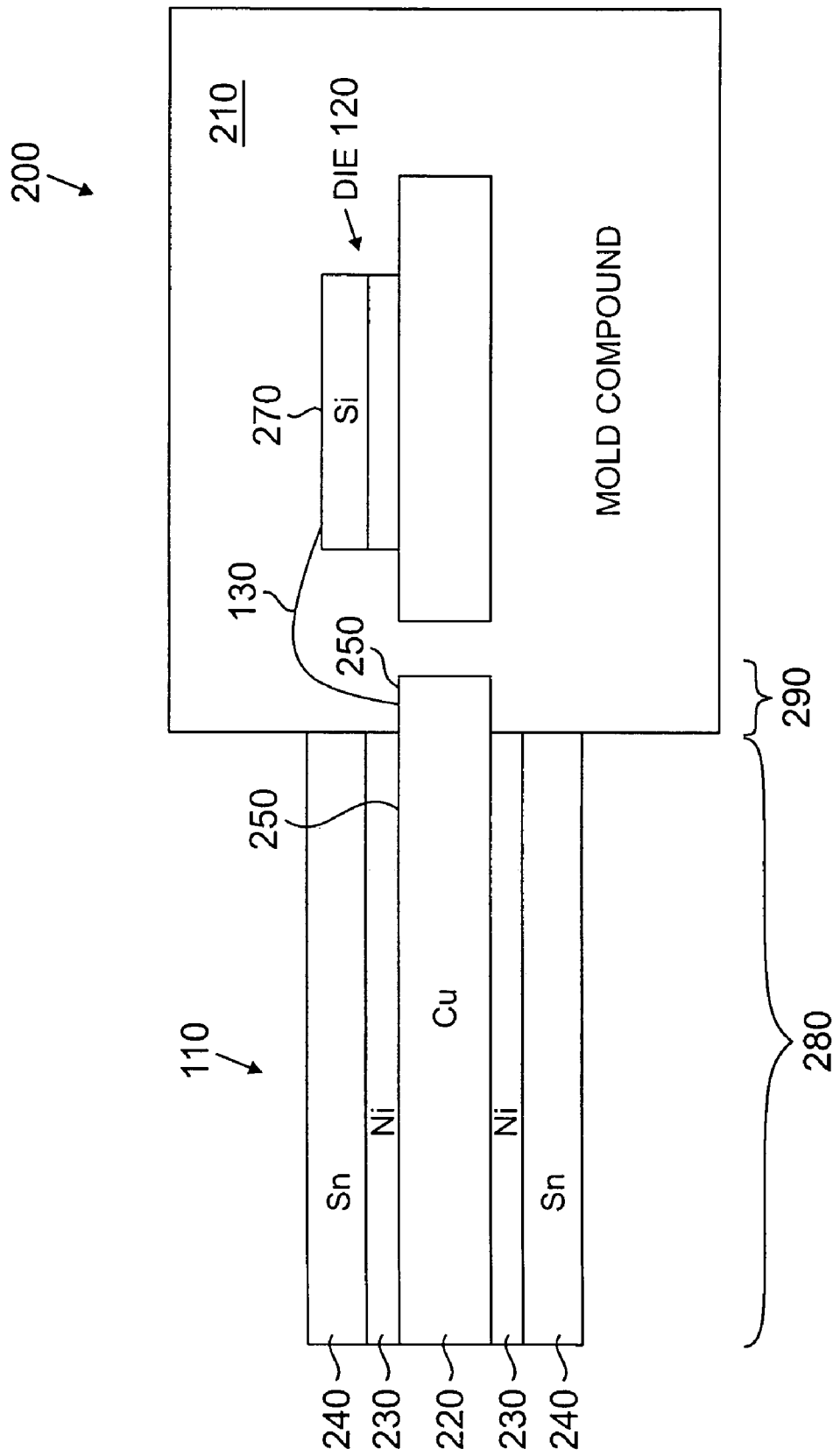
FIG. 2 is a cross-sectional view of the exemplary lead frame of FIG. 1 after molding and plating have been performed.

FIG. 2 shows a cross-sectional view of the lead frame 100 after an overmolding process has been performed to fill areas of the lead frame 100. A package 200 has been created. Package 200 comprises the semiconductor die 120 that has a top surface 270, a wire bond 130, a molded housing 210, and a conductive lead 110. Conductive lead 110 comprises a Cu core 220, a Ni underplate 230, and a Sn finish 240. Cu core 220 has a surface 250. Prior to molding to form the mold compound 210, the wire bond 130 is electrically coupled to surface 270 of the semiconductor die 120 and to surface 250 of the Cu core 220.

In the example of FIG. 2, the molded housing 210 is formed prior to plating processes. By forming the mold housing 210 first, there is an unplated portion 290 of the conductive lead 110 and, after plating, a plated portion 280 of the conductive lead 110. Two plating processes have been performed to plate the Cu 220. The first plating process forms the Ni underplate 230. The second plating process forms the Sn finish 240.

The package 200 is shown in FIG. 2 after a trim process, where the body 140 and tie bar 150 of the lead frame 100 have been trimmed. Typically, the trim process is combined with a form process, which forms the conductive lead 110 into shapes suitable for connecting to solder pads on a circuit board.

Figure 3A:
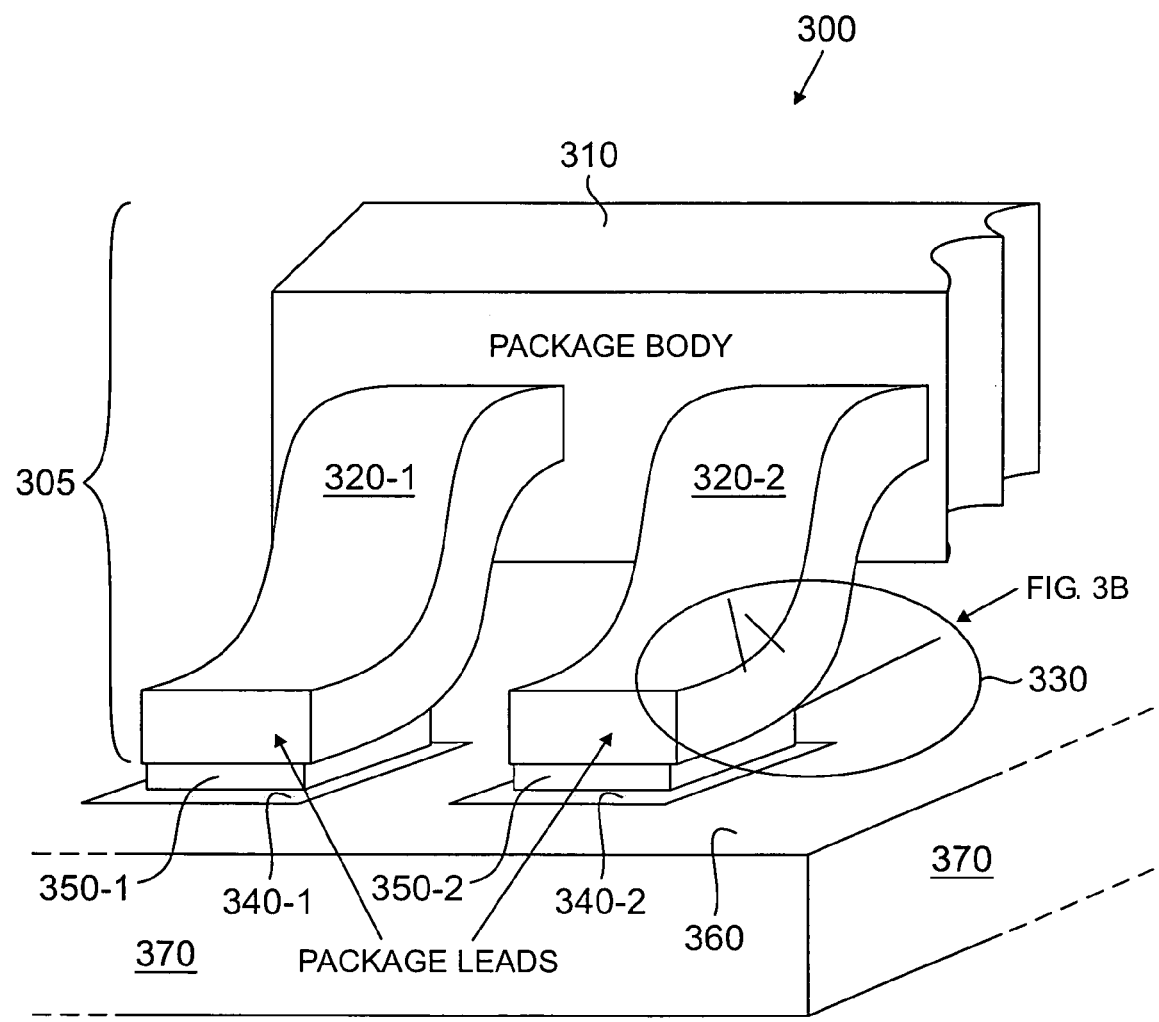
FIG. 3A shows an exemplary view of an electronic device having a package soldered to a circuit board, and shows a representation of whiskers on a conductive lead of the package.

Referring now to FIG. 3A, an electronic device 300 is shown. Electronic device 300 comprises a package 305 that is attached to a circuit board 370. Package 305 is an example of package 200 after the package 200 has been subjected to a form process, which forms conductive leads 110 into shapes suitable for connecting to solder pads on a circuit board. Other steps, as is known in the art, may also be performed on the package 200 to create package 305. As shown in FIG. 3A, the conductive leads 110 become formed conductive leads 320. Package 305 further comprises a package body 310.

Circuit board 370 comprises pads 340-1 and 340-2, to which leads 320-1 and 320-2, respectively, are connected by solder portions 350-1 and 350-2, respectively. Area 330 in FIG. 3A shows representations of Sn whiskers.

Figure 3B:
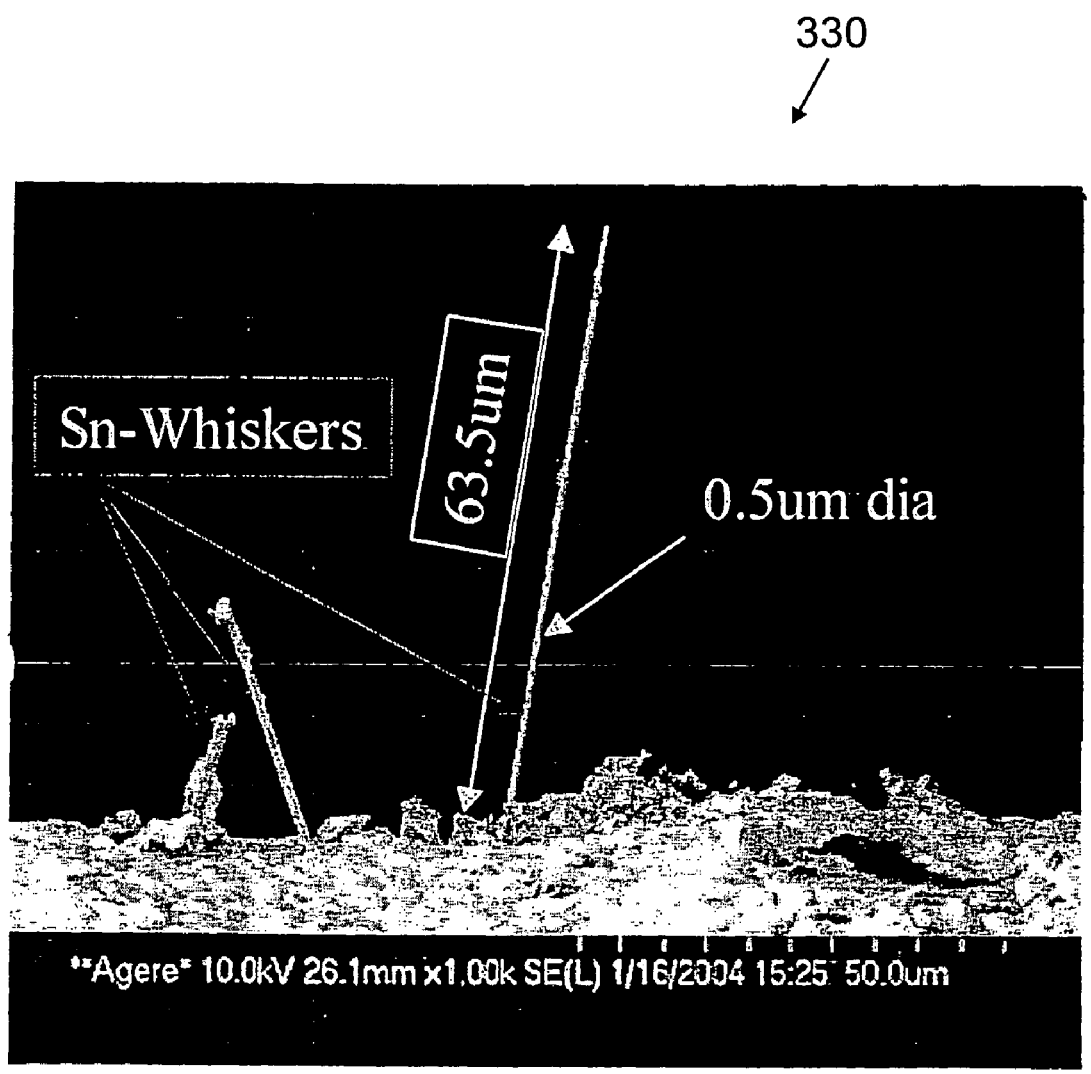
FIG. 3B shows a Scanning Electronic Microscope (SEM) view of the representation of whiskers in FIG. 3A.

FIG. 3B shows a Scanning Electron Microscope (SEM) view of whiskers, similar to the view of area 330 in FIG. 3A. In FIG. 3B, three Sn whiskers are shown. One whisker is 63.5 µm in length and is 0.5 µm in diameter. Thus, FIG. 3B illustrates a certain type of growth formation on a conductive lead.

FIG. 3B shows the Sn whiskers that developed after a package was stored for five weeks in a storage area at 60° C. and 93 percent RH. The package was a 176 conductive lead Thin Quad Flat Pack (TQFP) package, which had 15 µm matte-Sn plated onto Cu-core conductive leads after molding. A structure having a Sn finish plated over a Cu core is referred to as a "Cu/Sn structure" herein. There was no Ni underplate. The conductive leads were then trimmed and formed, after which the package was annealed at 150° C. for 1 hour. The anneal was performed less than two hours after the package was plated with Sn. The package was then subjected to a 260° C. peak simulated circuit board attach reflow process. The term "reflow," as used herein, means that a circuit board attachment process is performed. Even though the circuit board was subjected to 260° C., which is above the melting point of Sn, whiskers still developed. Additional data about whisker and flower development are shown below. Although, as indicated below, an anneal of greater than the melting point of Sn does reduce whisker formation for Cu/Sn structures, an anneal of greater than the melting point of Sn drastically reduces whisker formation for Cu/Ni/Sn structures. Thus, the Cu/Ni/Sn structure for conductive leads is a beneficial structure.

Figure 4:
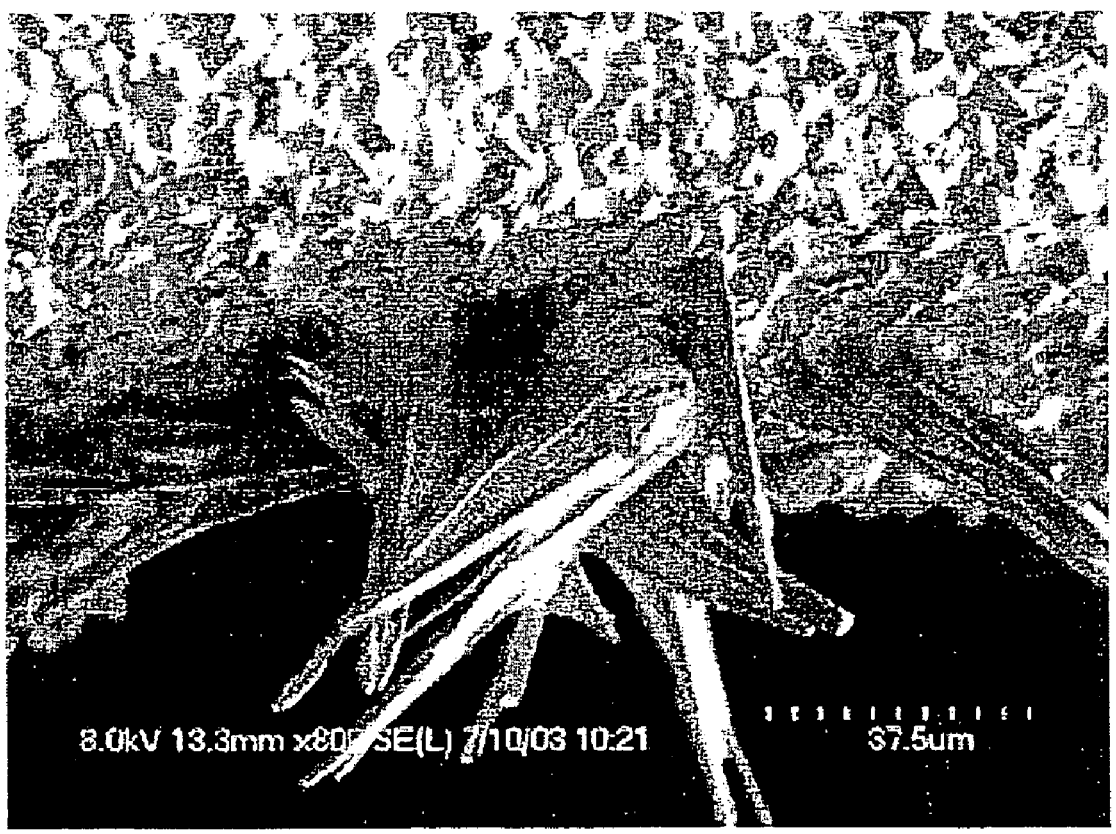
FIG. 4 shows an SEM view of flowers formed on a conductive lead.

FIG. 4 shows an SEM photograph of another growth formation called a flower. A flower comprises a number of whiskers that develop in close proximity. The conductive lead shown in FIG. 4 was from a package that had greater than 15 µm matte-Sn plated onto the leads after molding. There was no Ni underplate. The conductive leads were then trimmed and formed, after which the package was annealed at 150° C. for 1 hour. The package was subjected to 4570 hours of storage in an environment of 60° C. and 93 percent RH, with condensation.

The present invention provides methods that can reduce growth formations such as whiskers and flowers as shown in FIGS. 3B and 4, respectively. It should be noted that the term "reduction" includes elimination of growth formations, although elimination is not necessary.

Figure 5:
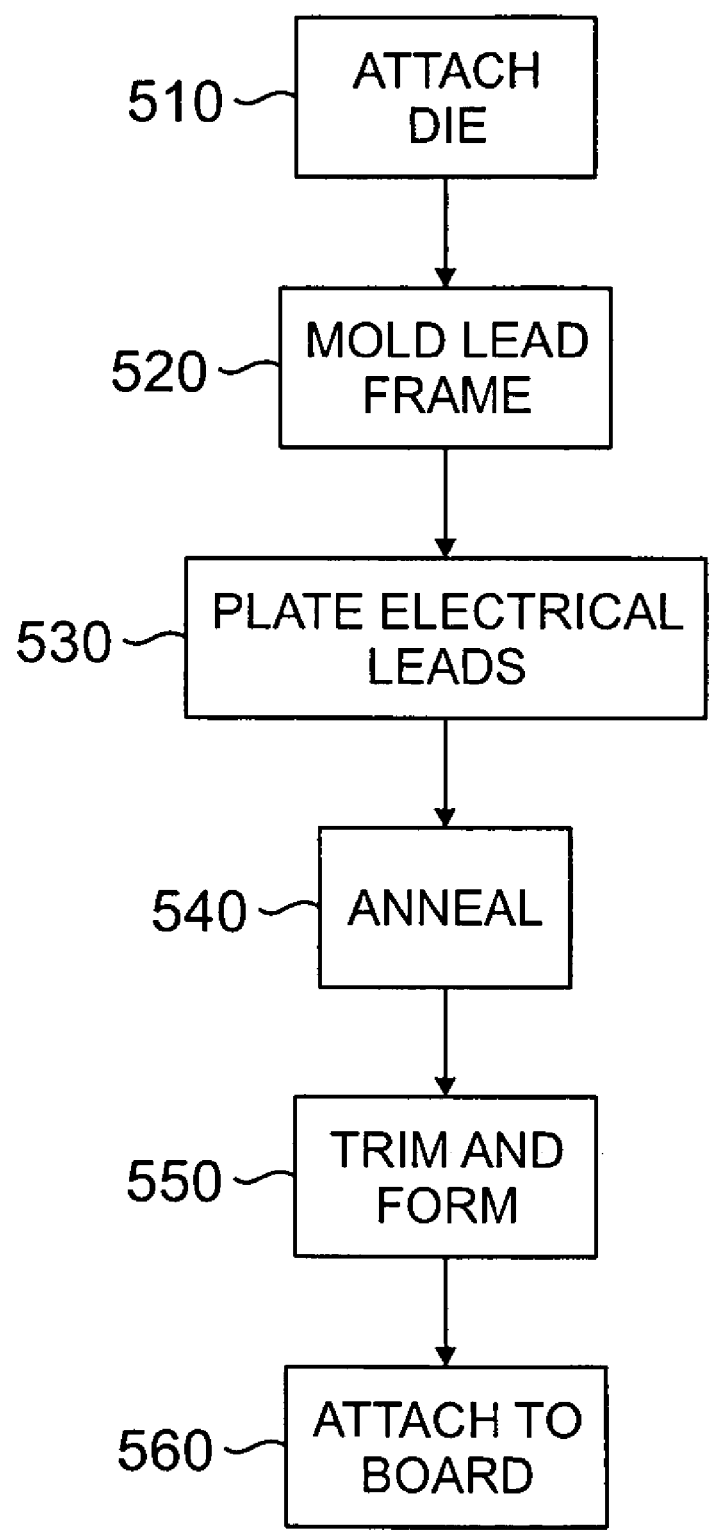
FIG. 5 shows a flow chart of an exemplary method for reducing growth formations on conductive leads.

FIG. 5 shows an exemplary method that can reduce or eliminate growth formations on conductive leads. Method 500 of FIG. 5 begins in step 510 when the semiconductor die is attached to the lead frame. Lead frame wires are wire bonded from each lead to a respective bond pad on the semiconductor die. In step 520, overmolding is performed to form a molded housing.

In step 530, plating is performed to plate the conductive leads of the lead frame. Step 530 can be performed multiple times if multiple layers of platings, such as different materials or multiple layers of the same material, are desired. In an exemplary embodiment, the Cu core of the conductive leads of the lead frame is plated with Ni. The resultant Ni layer is called Ni underplate. A suggested Ni layer for trim and form lead frame structures has a thickness of 0.3-3 µm. The maximum thickness of a Ni layer is approximately 1-5 µm, and is dictated by cracking. Nonetheless, for small lead bend radii, the Ni thickness can be greater than 5 µm. Moreover, if the Ni is plated after trim and form (see step 550), then the thickness of Ni is unlimited. The minimum thickness of Ni that is recommended to prevent complete dissolution of Ni during circuit board attach is approximately 0.6-0.8 µm. A thickness of 0.6-0.8 µm will generally ensure that Ni will remain after exposure to either a Pb-based or Pb-free solder attachment process. The Ni underplating could however be as thin as 0.1 µm if care is taken to insure that Ni is not completely consumed (e.g., through reaction with Sn) during circuit board attach.

When conductive leads of lead frames are made by other materials, such as the materials of alloy 42, which is used for Dynamic Random Access Memory (DRAM) devices because of the low cost of the alloy, Ni is also very helpful in reducing occurrences of Sn whiskers. Other material could be used in place of Ni. For example, the literature indicates Ag helps to reduce whisker formation in a similar way to Ni. It is beneficial if the underplating material reacts with Sn with a planar diffusion front such that local high strain areas in the Sn do not occur. Additionally, the present techniques may also limit whisker growth or other growth formations on other low melting point materials (e.g., indium, cadmium, zinc, and antimony) and even on higher melting point materials (e.g., Pb, iron, Ni, gold, silver, and palladium).

In step 530, the Ni underplating may then be followed by a Sn plating that forms a Sn finish over a Ni underplating. As the thickness of the Sn finish layer increases, resistance to whisker formation increases. It has been found, as shown below, that thickness in excess of 10 µm for the Sn finish layer for both the Cu/Sn and Cu/Ni/Sn structures produces the most whisker-resistant Sn finish layers in as-made noreflowed devices. As shown below, however, independent of thickness of the Sn finish layer, the Sn finish layer on Ni or Cu is not completely immune to whisker formation in the as-deposited state. Annealing at a temperature at or above approximately the melting point of the finish layer (e.g., a finish layer comprising Sn) is recommended to reduce or eliminate growth formations such as whiskers and flowers. To reduce growth formation, a Sn thickness of 3-25 μm is suggested. Less than 3 μm results in issues with scaping and removing of the Sn when the leads are physically bent during the forming operation. On the other hand, more than 25 μm makes the processing time interval too long to be economically feasible. As described above, thickness in excess of 10 μm for the Sn finish layer for the Cu/Ni/Sn structure produces the most whisker resistant Sn finish layers.

Step 530 may be performed through any techniques for forming a layer on a conductive lead, such as electroplating or electroless plating.

Following Sn plate, the package is subjected to a post plate anneal (step 540) at temperatures between about the melting point of Sn (about 232° C.) and about 260° C. for time of at least 1 second. The current specification in the industry for maximum temperature for Pb-free circuit board attach reflow is 260° C. This anneal can be performed prior to or post trim and form (step 550). The anneal time should be controlled to ensure that all of the Ni, which may be consumed because it reacts with Sn, is not consumed during the anneal process.

It should be noted that the anneal (step 540) can be performed at approximately the melting point of Sn, but many devices for annealing may not be that accurate. For instance, setting an anneal temperature such as 232° C. on an annealing device such as a temperature chamber may mean that a package might not actually reach 232° C., as the annealing device might have an accuracy of one or two percent, which could mean that 232° C. is never reached. Additionally, impurities in a Sn finish might affect the melting point of the Sn finish, and therefore an anneal of exactly 232° C. might not be a high enough of a temperature to melt the finish. Thus, the anneal should occur at least at about a temperature of the melting point of material (e.g., Sn plus impurities) making up the outer layer finish, here the Sn finish. It should be noted that the present invention can be applicable to finishes of alloys, so the anneal should be performed at a temperature of at least about the melting point of the alloy. Furthermore, the anneal step 540 should be performed so that at least a surface of the layer subject to growth formations (e.g., the finish layer) reaches the melting point of the layer.

This anneal step 540 could also be performed prior to circuit board attachment step 560 by the user or after the circuit board attachment step 560. The anneal step 540 may also be performed by a reflow, which is used to attach a package to a circuit board, as long as the reflow reaches temperatures of approximately the melting point of Sn or greater than the melting point of Sn. Many of the currently available Pb-free solders can take this temperature, including all of the Sn—Ag—Cu (SAC) alloys that are currently being used.

In the case of Ni underplate on a Cu/Ni/Sn structure, whisker formation is typically eliminated through the anneal step 540. This is shown in more detail below. It should be noted that in the case of a Cu/Sn structure, whisker formation is not eliminated by the after plate anneal step 540, but the after plate anneal step 540 still can reduce the number and size of whiskers.

The method of FIG. 5 is merely exemplary. The steps illustrated may be performed in a different sequence than shown and there may be additional steps, not shown, in the process. As explained above, the anneal (step 540) can be performed prior to or after the trim and form step 550 and prior to or after the attach step 560. In another embodiment, it is possible to have Ni plated (or appropriate alternative), as in step 530, on the Cu lead frame (or appropriate alternative lead frame material) prior to molding (step 520).

Embodiments of the present invention provide a Pb-free finish that is a low cost drop in replacement for Pb—Sn plating on conductive leads. The post plate anneal at temperatures greater than the melting point of the finish, such as a Sn finish, typically provides a whisker-free solution independent of the circuit board attach temperature. The post Sn plate anneal can eliminate whisker formation when circuit board attachment materials that have a lower melting point than 232° C. (melting point of Sn) are used. For example, material such as Pb, bismuth, and indium based solder alloys and any other polymeric circuit board attach materials typically use circuit board assembly temperatures that are less than 232° C.

FIGS. 6 through 11 illustrate various tests performed on Cu/Sn and Cu/Ni/Sn structures for conductive leads on lead frames. In the present disclosure, a "whisker" is defined as a growth formation that is greater than 10 μm in length. A whisker is defined this way so as to not to be confused by other stress-relaxation-type growths such as a hillock, which are typically less than 10 μm in length.

FIG. 6 shows a table illustrating whether growth formations were found on conductive leads comprising a Cu/Sn structure subjected to a 150° C. anneal. The top row indicates the thickness of the Sn finish on the Cu/Sn structure. The Test column is divided in the following manner: (1) room temperature storage for 5170 hours; (2) 60° C. storage for 2972 hours; (3) storage in an environment at 60° C. and 93 percent RH but with no observed condensation for 4570 hours; (4) storage in an environment at 60° C. and 93 percent RH with observed condensation for 4570 hours; and (5) 1750 cycles of temperature cycling from −55° C. to 85° C., where temperature cycling between −55° C. to 85° C. is a test commonly performed on electronic equipment.

Observations made during testing include the following. Whisker length increases over the first 2500 hours of storage at 60° C. and 93 percent RH, 60° C. and less than 10 percent RH, and room ambient. No additional growth was observed beyond 2500 hours. Whisker length increases over the first 1000 Temperature Cycles (TC) from −55° C. to 85° C., but no additional growth is observed between 1000 and 1700 cycles. Whisker formation (e.g., length and density of whiskers) is suppressed with an anneal at 150° C. for 1 hr. As-received Cu-lead frame finishing (e.g., using stamping or etching to form the lead frame) does not appear to have a first order affect on propensity for whisker growth. Global mechanical stress increases the propensity for whisker growth at 60° C. and 93 percent RH, which indicates that oxidation may be interacting with bending stress. Global mechanical stress does not appear to have a first order affect on the propensity for whisker growth at room ambient, 60° C. and less than 10 percent RH, and −55° C. to 85° C. TC.

Figure 7:
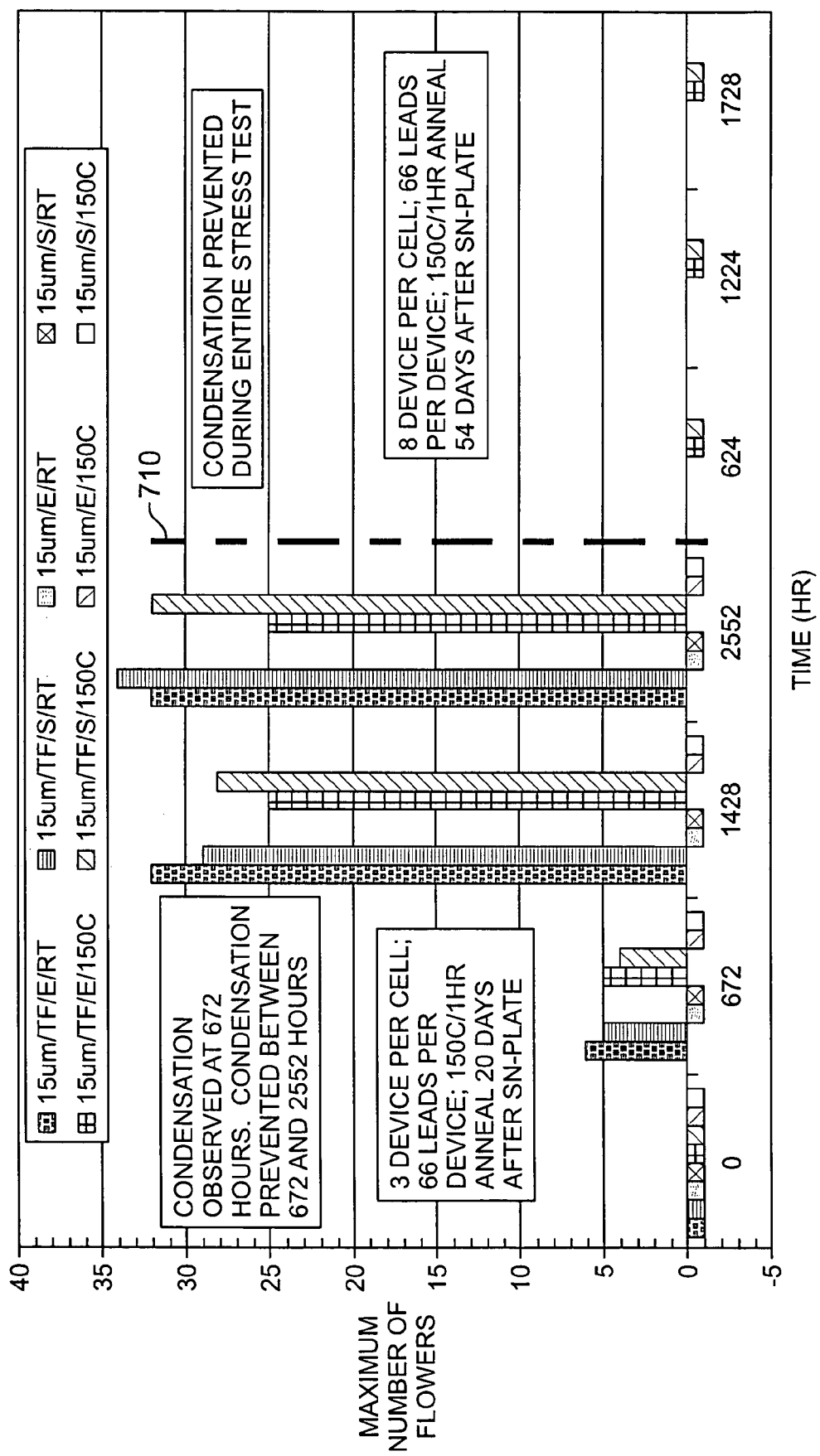
FIG. 7 shows a graph illustrating whether growth formations were found on Sn-plated Cu conductive leads under various types of processing, tests, and annealing.

FIG. 7 shows a graph illustrating whether growth formations were found on conductive leads having Cu/Sn structures under various types of processing, tests, and annealing. FIG. 7 illustrates tests performed to determine effects of condensation on formation and growth of flowers. FIG. 7 shows the maximum number of observed flowers per package, where packages were stored at 60° C. and 93 percent RH, and where the packages had a 15 µm thick matte Sn finish on the conductive leads.

The "TF" indicates that a trim and form process was performed. "E" indicates that etching was used to form the lead frame. "S" indicates that stamping was used to form the lead frame. "RT" indicates that no anneal was performed, so that the tests were performed at room temperature. "150° C." indicates that the packaged integrated circuit was subjected to a 150° C. bake for one hour. On the bottom axis, the different tests are ordered as follows: 15 µm/TF/E/RT, 15 µm/TF/S/RT, 15 µm/E/RT, 15 µm/S/RT, 15 µm/TF/E/150 C, 15 µm/TF/S/ 150 C, 15 µm/E/150 C, and 15 µm/s/150 C.

Line 710 is a barrier between two separate series of tests. In the first series of tests, samples had three devices per cell, with 66 conductive leads per device and 132 leads per package. Half of the leads were evaluated in this experiment. A cell is a set of devices, in this case three devices, that were processed with the same materials and conditions. A 150° C., one-hour anneal was performed 20 days after a Sn-plating step and prior to the first series. In the first series of tests, condensation was prevented after 672 hours. The first series of tests shows that the four samples that were not subjected to the trim and form step did not experience flower growth.

The second series of tests used samples having eight devices per cell, with 66 conductive leads per device. Condensation was prevented for the duration of the stress test. Prior to the second series of tests, a 150° C. anneal was performed for one hour 54 days after a Sn-plating step. The 151 µm/TF/E/150 C and 15 mm/TF/S/150 C samples that were subjected to the test never developed flowers.

FIG. 8 shows a table illustrating whether growth formations were found on two types of plated conductive leads under various types of processing, tests, and annealing. The first column in FIG. 8 lists the structure type for the conductive leads. The structures tested were Cu/Sn and Cu/Ni/Sn structures. The final number in the first column indicates thickness of the Sn finish. For instance, "Cu/Ni/Sn/1.5" indicates that a Cu/Ni/Sn structure was used having a 1.5 µm thick Sn finish. Matte Sn was used in all tests.

The materials and process variables for the tests shown in FIG. 8 were as follows. Ni was pre-plated on 84 lead packages for the Cu/Ni/Sn structures. The pre-Sn/post-Ni plate conductive leads were trimmed. The Ni thickness was 4 µm. The Cu was a 7025 alloy on 176 lead packages for the Cu/Sn structures. All lead packages were trimmed and formed. The information in the column with "Bake" indicates whether an anneal was performed after a Sn plating step. The post-Sn plate anneal was 150° C. for 1 hour, performed within two hours post-plating, after trim and form. There were evaluations on 5, 20, 40 days post-plate. There were Sn/Pb finish devices as controls, although data from the controls are not shown.

The tests performed were as follows:

(1) Storage at uncontrolled Room Temperature (RT), 20-25° C., 40-75 percent RH. The shown data was taken at 56 days, but the tests ran for greater than four months.

(2) Temperature Cycling (TC), 2000 cycles, each cycle from –55° C. to +85° C. with a 30 minute half cycle.

(3) Storage at 60° C. and 93 percent RH, with observed water condensation, for greater than four months (data shown from 68 days). Condensation was observed in the first set of devices used for this condition. Subsequently, a shroud was instituted that prevented condensation from occurring on the devices.

(4) Storage at 60° C. and 93 percent RH storage with bias, greater than 4 months duration (data shown at 68 days). The bias was performed on five pairs of leads at 3.3 volts (V) and 10 pairs of leads at five volts. The remaining leads were left floating. Devices were placed into test Thermal Humidity Bias (THB) sockets. Inspections were performed at 5 weeks, 10 weeks, and 16 weeks. Condensation was not observed in this experiment.

The "$T_{reflow}$" column indicates whether a post-Sn plate anneal was performed. In the example of FIG. 8, anneals were performed by using a simulated solder reflow with peak temperatures of 215° C. or 260° C. These reflows cause anneals of approximately 15-25 seconds. The reflow simulated a circuit board attach reflow process; however the devices were never attached to a circuit board.

FIG. 8 shows that heat treating at greater than the melting point of Sn will reduce whiskers in all environments for Cu/Ni/Sn structures for conductive leads.

It should be noted that packages will typically be subjected to some reflow in order to attach the packages to circuit boards. Reflow will heat the packages and conductive leads to some degree. Thus, the data in FIG. 8 showing no reflow is illustrative from a storage standpoint, but is not illustrative with respect to use of the packages. Use of the packages is better illustrated by the data indicating that a 215° C. or a 260° C. reflow was performed.

FIG. 9 shows a table illustrating a time evolution in a non-condensing environment for growth formations on two types of plated conductive leads under various types of processing, tests, and annealing. FIG. 9 shows data for a non-condensing environment at 60° C. and 93 percent RH for a certain time period. "On test" means that the packages were still being tested as of the time FIG. 9 was created. It should be noted that both condensation and non-condensation tests were performed. The two rows for Cu/Sn/15 with a bake but without reflow occur because two experiments were performed on these devices to ensure that valid results were achieved. The reflow was a simulated circuit board attachment for 15-25 seconds at a temperature of 260° C.

From the data presented by FIG. 9, the conclusion can be drawn that an anneal at 260° C. of a Cu/Ni/Sn structure for conductive leads reduces whisker formation.

While FIG. 9 shows a time progression of growth formations under storage conditions, FIG. 10 shows growth formation data under storage conditions on a single date from the beginning of storage. FIG. 10 shows a table illustrating whether growth formations were found on two types of plated conductive leads under various types of processing and annealing in a condensing environment during storage. This was a condensation storage test at 60° C. and 93 percent RH for 68 days. As can be seen in FIG. 10, an anneal at 260° C. of a Cu/Ni/Sn structure for conductive leads reduces whisker and flower formations.

While FIGS. 9 and 10 show data for packages subjected to storage conditions, FIG. 11 shows data for packages subjected to temperature cycling. FIG. 11 shows a table illustrating whether growth formations were found on two types of plated conductive leads under various types of processing and annealing when subjected to 1000 cycles of temperature from –55° C. to 85° C.

As can be seen, FIG. 11 shows that anneals of temperatures of about or greater than the melting point of Sn reduce whisker formation on Cu/Sn and Cu/Ni/Sn structures for conductive leads. FIG. 11 also shows the observed density and length of the whiskers. It can be seen that increasing the temperature of the anneal decreases the density and length of the whiskers. The temperature of 235° C. was used as the annealing equipment has an error of around one percent, so using the temperature of 235° C. ensured that the melting point of Sn was met.

As shown in other figures, whiskers are not eliminated for the Cu/Sn structures in certain instances, such as when the package having the conductive leads is placed in a condensing environment. Nonetheless, FIG. 11 shows that anneals of the Cu/Sn structure for conductive leads is beneficial in that the anneals reduce the density and length of whiskers.

A summary of FIGS. 6-11 is as follows.

For matte Sn on Cu, with a post-plate 150° C. bake:

(1) Reflow with less than 232° C. anneal during reflow: whiskers were found in temp cycling; flowers were found in storage with conditions of condensing 60° C. and 93 percent RH; no whiskers were found in storage with either 60° C. and 93 percent RH or ambient storage.

(2) Reflow with greater than 232° C. anneal during, before or after reflow: whiskers were found in 60° C. and 93 percent RH; no flowers were found; no whiskers in temp cycling or ambient storage.

Ni underplate is beneficial, as shown above, to minimize the risk of whisker growth after Pb-Free attach processes. On Cu/Ni/Sn structure for conductive leads, 5-40 μm long, 5-10 um diameter whiskers were found after 1000 and 2000 temp cycles. The length and density is dependent upon reflow (e.g., anneal) temperature: when the reflow temperature is below the melting point of Sn, the closer reflow temp is to the melting point of Sn (232° C.), the smaller and less dense whiskers and flowers are; when the reflow temperature is (or a separate anneal is performed at) temperatures above the melting point of Sn, then whiskers and flowers are eliminated. It should be noted that there may be some growth formations even when an anneal of about or greater than the melting point of Sn is used on Cu/Ni/Sn structures for conductive leads. However, the density and length of whiskers is reduced. In other words, in the previous figures, to be a "whisker," a growth formation had to be approximately 10 μm or greater in length. Therefore, there could be instances where growth formations were formed that were 5 μm (for example) but the term "no whiskers" was used.

It is to be understood that the embodiments and variations shown and described herein are merely illustrative of the principles of this invention and that various modifications may be implemented by those skilled in the art without departing from the scope and spirit of the invention.

We claim:

1. A method for reducing growth formations on one or more plated conductive leads, the method comprising the step of annealing the one or more plated conductive leads at a predetermined temperature, the one or more plated conductive leads plated with one or more layers, each layer comprising a material, the predetermined temperature greater than or equal to approximately a melting point of one of the materials, wherein said annealing step reduces growth formations in comparison to a solder reflow process.

2. The method of claim 1, further comprising one or more steps of plating one or more conductive leads comprising a core with each of the one or more materials to create the plated one or more conductive leads.

3. The method of claim 2, further comprising the steps of trimming and forming the plated conductive leads, wherein the steps of trimming and forming occur before or after the one or more steps of plating and before or after the step of annealing.

4. The method of claim 1, wherein the step of annealing comprises the step of reflowing the one or more plated conductive leads at at least at the predetermined temperature to attach the one or more plated conductive leads to a circuit board.

5. The method of claim 1, further comprising the step of reflowing the one or more plated conductive leads to attach the one or more plated conductive leads to a circuit board.

6. The method of claim 1, wherein:
the one or more conductive leads comprise a core comprising copper;
the one or more layers comprise a finish comprising tin; and
the predetermined temperature is greater than or equal to approximately a melting point of the finish.

7. The method of claim 6, wherein:
the one or more conductive leads comprise a core consisting essentially of copper; and
the one or more layers comprise a finish consisting essentially of tin.

8. The method of claim 6, wherein the finish is between 3 to 25 micrometers in thickness.

9. The method of claim 7, wherein the finish is between 10 to 25 micrometers in thickness.

10. The method of claim 6, wherein the predetermined temperature is greater than or equal to approximately a melting point of tin.

11. The method of claim 10, wherein the predetermined temperature is less than or equal to approximately 260 degrees centigrade.

12. The method of claim 6, further comprising the step of plating the core with a material comprising tin to create the finish.

13. The method of claim 1, wherein:
the one or more layers comprise an underplate and a finish, the underplate comprises nickel, and the finish comprises tin; and
the one or more plated conductive leads comprise a core comprising copper; and
the predetermined temperature is greater than or equal to approximately a melting point of the finish.

14. The method of claim 13, wherein:
the one or more conductive leads comprise a core consisting essentially of copper; and
the one or more layers comprise an underplate consisting essentially of nickel and a finish consisting essentially of tin.

15. The method of claim 13, wherein the underplate has a thickness between 0.3 and three micrometers.

16. The method of claim 13, further comprising the steps of:
plating the core with a material comprising nickel to create the underplate; and
plating the underplate with a material comprising tin to create the finish.

17. The method of claim 13, wherein the step of annealing is performed for a predetermined time, wherein the predetermined time is at least one second and is less than a time determined to ensure that all of the nickel is not consumed during the anneal step.

18. The method of claim 1, wherein step of annealing is performed for at least one second.

19. The method of claim 1, wherein:
the one or more conductive leads comprise a core comprising copper;
the one or more layers comprise an underplate comprising silver and a finish comprising tin; and
the predetermined temperature is greater than or equal to approximately a melting point of the finish.

20. The method of claim 1, wherein:
the one or more layers comprise a finish comprising one or more of indium, cadmium, zinc, antimony, lead, iron, nickel, gold, silver, and palladium; and
the predetermined temperature is greater than or equal to approximately a melting point of the finish.

21. The method of claim 1, wherein the one or more conductive leads comprise a core comprising one or more of copper, copper alloy and alloy 342.

22. An apparatus comprising one or more plated conductive leads and made by a process comprising the step of annealing at least the one or more plated conductive leads at a predetermined temperature, the one or more plated conductive leads plated with one or more layers, each layer comprising a material, the predetermined temperature greater than or equal to approximately a melting point of one of the materials, wherein said annealing step reduces growth formations in comparison to a solder reflow process.

23. The apparatus of claim 22, wherein:
the one or more plated conductive leads are a plurality of plated conductive leads;
the apparatus comprises a package; and
the plurality of plated conductive leads are part of the package.

24. The apparatus of claim 23, wherein the apparatus further comprises a circuit board coupled to the plurality of plated conductive leads.

25. The apparatus of claim 22, wherein the apparatus comprises an integrated circuit coupled to the one or more plated conductive leads.

26. An integrated circuit comprising one or more plated conductive leads plated with one or more layers, wherein the one or more conductive leads have been annealed at a predetermined temperature greater than or equal to a melting point of one of the one or more layers, wherein said annealing step reduces growth formations in comparison to a solder reflow process.

* * * * *

UNITED STATES PATENT AND TRADEMARK OFFICE
CERTIFICATE OF CORRECTION

PATENT NO. : 7,368,326 B2
APPLICATION NO. : 10/855148
DATED : May 6, 2008
INVENTOR(S) : Osenbach et al.

It is certified that error appears in the above-identified patent and that said Letters Patent is hereby corrected as shown below:

In the specification, column 4, line 38, after "0.3-" and before "µm" replace "31" with -- 3 --.

Column 9, line 29, before "µm" replace "151" with -- 15 --; line 29 after "15" and before "/TF/S/150" replace "mm" with -- µm --.

In claim 21, column 13, line 9, after "and alloy" replace "342" with -- 42 --.

Signed and Sealed this

Fourth Day of November, 2008

JON W. DUDAS
*Director of the United States Patent and Trademark Office*